(12) United States Patent
Min

(10) Patent No.: US 9,947,860 B2
(45) Date of Patent: Apr. 17, 2018

(54) SPIN TORQUE MAJORITY GATE DEVICE

(71) Applicant: IMEC VZW, Leuven (BE)

(72) Inventor: Tai Min, San Jose, CA (US)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 14/970,215

(22) Filed: Dec. 15, 2015

(65) Prior Publication Data

US 2016/0172581 A1    Jun. 16, 2016

(30) Foreign Application Priority Data

Dec. 16, 2014  (EP) .................................... 14198264

(51) Int. Cl.

| | | |
|---|---|---|
| H01L 43/02 | (2006.01) | |
| H01L 43/10 | (2006.01) | |
| H01F 10/32 | (2006.01) | |
| H01L 43/08 | (2006.01) | |
| H03K 19/23 | (2006.01) | |
| H01F 41/32 | (2006.01) | |

(52) U.S. Cl.
CPC ........... *H01L 43/02* (2013.01); *H01F 10/329* (2013.01); *H01F 10/3286* (2013.01); *H01L 43/08* (2013.01); *H01L 43/10* (2013.01); *H03K 19/23* (2013.01); *H01F 41/325* (2013.01)

(58) Field of Classification Search
CPC ....... H01L 43/08; H01L 27/228; H01L 43/02; H01L 43/10; G11C 11/16; B82Y 25/00; B82Y 10/00; H01F 10/329; H01F 10/3286; H01F 41/325; H03K 19/23
See application file for complete search history.

(56) References Cited

U.S. PATENT DOCUMENTS

| | | | | |
|---|---|---|---|---|
| 6,269,018 | B1 * | 7/2001 | Monsma | G11C 11/15 257/E27.005 |
| 8,198,692 | B2 | 6/2012 | Nikonov et al. | |
| 8,450,818 | B2 | 5/2013 | Nikonov et al. | |
| 2006/0133137 | A1 * | 6/2006 | Shin | G11C 11/15 365/158 |
| 2010/0321993 | A1 * | 12/2010 | Nikonov | B82Y 25/00 365/171 |

(Continued)

FOREIGN PATENT DOCUMENTS

WO    WO 2011/075257 A2    6/2011

OTHER PUBLICATIONS

European Search Report dated Jul. 10, 2015 in European Application No. 1419264.5.

(Continued)

*Primary Examiner* — Allen Parker
*Assistant Examiner* — Long H Le
(74) *Attorney, Agent, or Firm* — Knobbe, Martens, Olson & Bear LLP

(57) ABSTRACT

The disclosed technology generally relates to magnetic devices, and more particularly to spin torque devices. In one aspect, a spin torque majority gate device includes a free ferromagnetic layer, a spin mixing layer formed above the free ferromagnetic layer, a non-magnetic tunnelling layer formed above the spin mixing layer, and a plurality of input elements formed above the non-magnetic tunnelling layer, where each input element has a fixed ferromagnetic layer.

17 Claims, 2 Drawing Sheets

(56) References Cited

U.S. PATENT DOCUMENTS

| | | | | |
|---|---|---|---|---|
| 2011/0147816 A1* | 6/2011 | Nikonov | ................ | B82Y 25/00 |
| | | | | 257/295 |
| 2011/0149670 A1* | 6/2011 | Heo | ........................ | B32B 9/00 |
| | | | | 365/225.5 |
| 2012/0038387 A1* | 2/2012 | Nikonov | ................ | B82Y 25/00 |
| | | | | 326/35 |
| 2012/0135275 A1 | 5/2012 | Kariyada et al. | | |
| 2012/0248556 A1 | 10/2012 | Nikonov et al. | | |
| 2013/0149499 A1* | 6/2013 | Lee | ........................ | H01L 43/12 |
| | | | | 428/156 |
| 2014/0111283 A1* | 4/2014 | Nikonov | ................ | H01L 43/08 |
| | | | | 331/94.1 |
| 2014/0292318 A1* | 10/2014 | Wang | .................... | B82Y 25/00 |
| | | | | 324/228 |

OTHER PUBLICATIONS

Nikonov et al. "Proposal of a Spin Torque Majority Gate Logic," Aug. 8, 2011, IEEE Electron Device Letters, IEEE Service Center, New York, NY, vol. 32, No. 8: 1128-1130.

\* cited by examiner

SPIN TORQUE MAJORITY GATE DEVICE

CROSS-REFERENCE TO RELATED APPLICATIONS

This application claims foreign priority to European application EP 14198264.5 filed Dec. 16, 2014, the content of which is incorporated by reference herein in its entirety.

BACKGROUND

Field

The disclosed technology generally relates to magnetic devices, and more particularly to spin torque devices.

Description of the Related Technology

In the so-called "post Moore era," spintronics devices or spin torque devices have become increasingly popular because they can potentially offer new and improved characteristics over traditional devices such as transistor-based devices, making such devices promising candidates for future logic and memory applications.

In general, the operation of spin torque devices is based on a phenomenon known as spin transfer torque. According to this phenomenon, when a current is passed through a magnetization layer having a fixed magnetization, sometimes referred to as a fixed layer, the resulting current can become spin polarized. In other words, a majority of the electrons passing through the magnetization layer possess the same spin and are oriented, e.g., in the same direction of magnetization as that of the fixed layer. Such electrons are referred to as spin-polarized electrons.

When the spin-polarized electrons pass through one or more non ferromagnetic layers, such as a tunnelling layer, and injected into a subsequent magnetic layer, the spin of the spin-polarized electrons can transfer a spin torque to the magnetization of the subsequent magnetic layer. The subsequent magnetic layer is generally referred to as a free layer. The transfer of the spin torque to the magnetization of the free layer can result in a change, e.g., a switching, in the magnetization orientation of the free layer.

When the current the current passing through the free layer exceeds a certain critical value, the magnetization of the free layer may be switched. The magnitude of the critical current is determined by many factors, including the materials and dimensions of the layers of the stack (sometimes referred to as the magnetic tunnelling junction (MTJ)), which can include the fixed layer, the free layer and the tunneling layer as described above, as well as its surroundings.

However, the magnetization of the fixed layer may still remain unchanged since the current used may not be strong enough to affect the magnetization of the fixed layer although being sufficient to switch the magnetization of the free layer.

Generally the state of the free layer may be read out by measuring the magneto-resistance of the free layer.

A type of spin torque device is a spin torque majority gate. A spin torque majority gate is a logic device whose output depends on the majority of its multiple inputs. A spin torque majority gate and a method for manufacturing the device are disclosed in WO 2011/075257 A2. The described spin torque majority gate aims at setting the magnetization of the free layer based on the majority of inputs. However, to realize such an effect has proven hard since e.g. the magnetization of the free layer is not reliably set resulting in that readout of the device is difficult or even impossible. The difficulties of reading out may for instance relate to undesired domain walls being formed within the free layer, restraining the magnetization of the free layer in an unfavourable manner, setting a wrong magnetization state after writing operation.

Hence, there is a need for an improved spin torque majority gate device.

SUMMARY OF CERTAIN INVENTIVE ASPECTS

It is an object of the disclosed embodiments to provide improvements over the above techniques and the prior art.

A particular object is to provide a spin torque majority gate device that allows for a more reliable setting of the free ferromagnetic layer resulting in that a subsequent readout is simplified or less prone to write errors.

These and other objects as well as advantages that will be apparent from the following description of the present disclosure are achieved by a spin torque majority gate device according to the independent claim. Preferred embodiments are defined in the dependent claims.

In one aspect, a spin torque majority gate device comprises a free ferromagnetic layer, a spin mixing layer arranged above the free ferromagnetic layer, a non-magnetic tunnelling layer arranged above the spin mixing layer, a plurality of input elements arranged above the non-magnetic tunnelling layer, each input element comprising a fixed ferromagnetic layer.

In use, the magnetization of the free ferromagnetic layer may be set in a reliable manner resulting in that the magnetization of the free ferromagnetic layer becomes more evenly distributed and homogenous. This is achieved by introducing a spin mixing layer. The spin mixing layer allows for mixing of spin of electrons occurring when currents are passed through the plurality of input elements. The spin mixing enables that the free ferromagnetic layer of the spin torque majority gate device may be affected by substantially a single net spin relating to the majority of electron spins originating from the respective input elements. In other words, the free ferromagnetic layer will be affected by substantially a single net spin corresponding to the majority of electron spins generated by the respective input elements.

More specifically the spin mixing layer is arranged between the free ferromagnetic layer and the non-magnetic tunnelling layer of the spin torque majority gate device. The plurality of input elements are arranged on an opposite side of the non-magnetic tunnelling layer, i.e. side facing away from the spin mixing layer.

The use of a spin mixing layer allows for a larger design freedom when designing the spin torque majority gate device as the net spin resulting from currents being passed through the plurality of input elements are mixed. The mixing of the electron spins in the spin mixing layer thus results in that the mutual distances between the respective input elements become less important, for setting the magnetization of the free ferromagnetic layer homogenously. This results from that the respective electron spins are mixed in the spin mixing layer, such that the free ferromagnetic layer is substantially affected by a single net spin irrespective of the positioning of the respective input elements. The single net spin being related to the majority of electron spins originating from the respective input elements.

It should be noted that within the context of this application the term "spin mixing layer" may be a layer of any material having a spin coherence length being sufficiently large, such that the respective electron spins occurring when currents are passed through the plurality of input elements are preserved and mixed, resulting in that the free ferromagnetic layer of the spin torque majority gate device is substantially affected by a single net spin.

It should be noted that within the context of this application the term "above" refers to a relative relation of the positioning of the layers. Hence, the wording above only indicates how the respective layers are located in relation to each other and has nothing to do with the orientation of the device as such.

The spin torque majority gate device may further comprise an output element arranged above the non-magnetic tunnelling layer and comprising a fixed ferromagnetic layer. By arranging an output element comprising a fixed ferromagnetic layer above the non-magnetic tunnelling layer, the magnetization of the free ferromagnetic layer of the spin torque majority gate device may efficiently be read out. It is thus possible to draw conclusions regarding a majority of inputs based on the state of the free ferromagnetic layer, as read out by the output element of the device. Hence, the magnetization as read out by the output element may for example represent a computational variable or similar.

The spin mixing layer of the spin torque majority gate device may comprise a material having a spin coherence length being larger or equal to a maximum distance between the plurality of input elements, which is advantageous in that the electron spins originating from the respective input elements may be mixed such that the free ferromagnetic layer of the device will be affected by substantially a single net spin. In other words, a spin coherence length being larger or equal to a maximum distance between the plurality of input elements enables that the respective electron spins inputted to the spin mixing layer are mixed in an efficient manner meaning that all inputted electron spins are mixed.

The spin mixing layer of the spin torque majority gate device may comprise a material having a spin coherence length being larger or equal to a maximum distance between any of the plurality of input elements and the output element, which is advantageous in that a more reliable setting and readout of the free ferromagnetic layer of the of the spin torque majority gate device may be achieved.

The spin mixing layer of the spin torque majority gate device may comprise a material chosen from a group consisting of Cu, CuN, Au, Ag, and alloys thereof, which is advantageous in that an efficient spin mixing layer having a desired spin coherence length may be achieved.

The spin mixing layer of the spin torque majority gate device may comprise graphene, which is advantageous in that an efficient spin mixing layer having a desired spin coherence length may be achieved.

The spin torque majority gate device may further comprise an additional non-magnetic tunnelling layer arranged below the free ferromagnetic layer, and an additional fixed ferromagnetic layer arranged below the additional non-magnetic tunnelling layer, such that a magnetic tunnelling junction is formed by at least portions of the free ferromagnetic layer, the additional non-magnetic tunnelling layer and the additional fixed ferromagnetic layer. By forming a magnetic tunnelling junction by arranging an additional non-magnetic tunnelling layer below the free ferromagnetic layer, and an additional fixed ferromagnetic layer below the additional non-magnetic tunnelling layer, the readout of the spin torque majority gate device may be improved. In other words a stronger readout signal may be achieved by the formation of a magnetic tunnelling junction.

The ferromagnetic layers of the spin torque majority gate device may have an in-plane magnetization, which is advantageous that a device which is easy to fabricate is achieved.

The ferromagnetic layers of the spin torque majority gate device may have an out-of-plane magnetization, which is advantageous in that a stronger and more distinct read out signal may be achieved as compared when the ferromagnetic layers have an in-plane magnetization.

The non-magnetic tunnelling layer of the spin torque majority gate device may comprise a material chosen from a group consisting of MgO, $Al_2O_3$, $TiO_2$, and $Ta_2O_5$, which is advantageous in that an efficient tunnelling barrier may be achieved.

A surface of the free ferromagnetic layer facing the spin mixing layer may have an area being smaller than an area of a surface of the of the spin mixing layer facing the free ferromagnetic layer, which is advantageous in that the design freedom of the device is increased and at the same time the device may be made smaller.

The ferromagnetic layers of the spin torque majority gate device may comprise a material chosen from a group consisting of CoPt, FePt, CoFeB, TbCoFe, CoFe and NiFe.

Further features of, and advantages with, the present embodiments will become apparent when studying the appended claims and the following description. The skilled person will realize that different features of the disclosed embodiments may be combined to create embodiments other than those described in the following, without departing from the scope of the disclosure.

BRIEF DESCRIPTION OF THE DRAWINGS

Various aspects of the embodiments, including their particular features and advantages, will be readily understood from the following detailed description and the accompanying drawings, in which.

DETAILED DESCRIPTION OF CERTAIN ILLUSTRATIVE EMBODIMENTS

Figure 1:
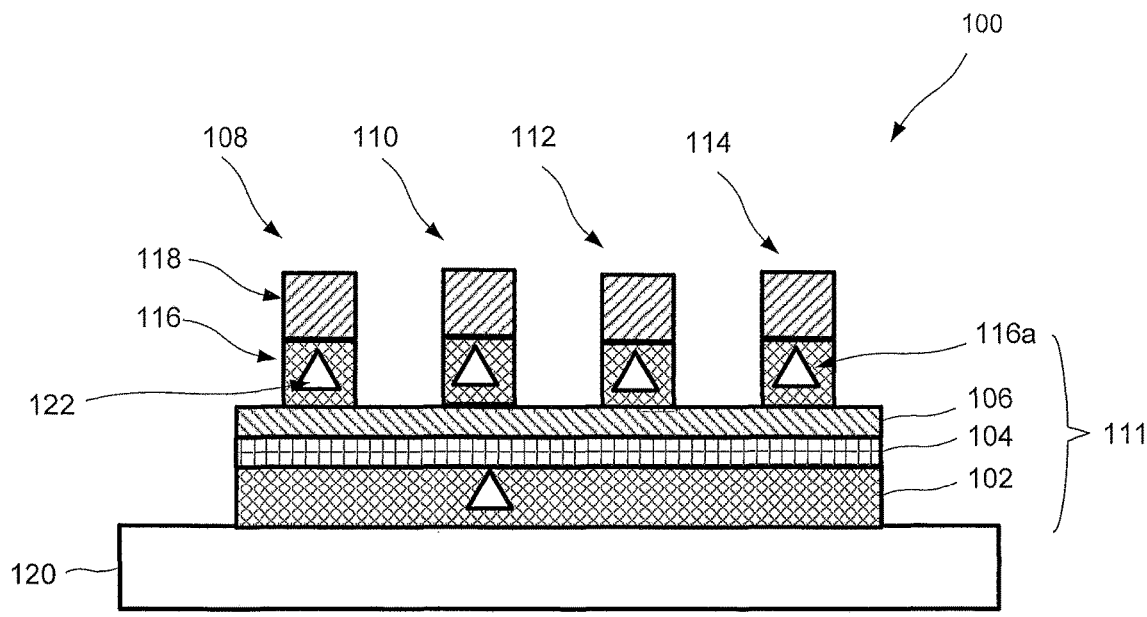
FIG. 1 illustrates a cross-sectional side view of a spin torque majority gate device according to some embodiments.
Figure 2:
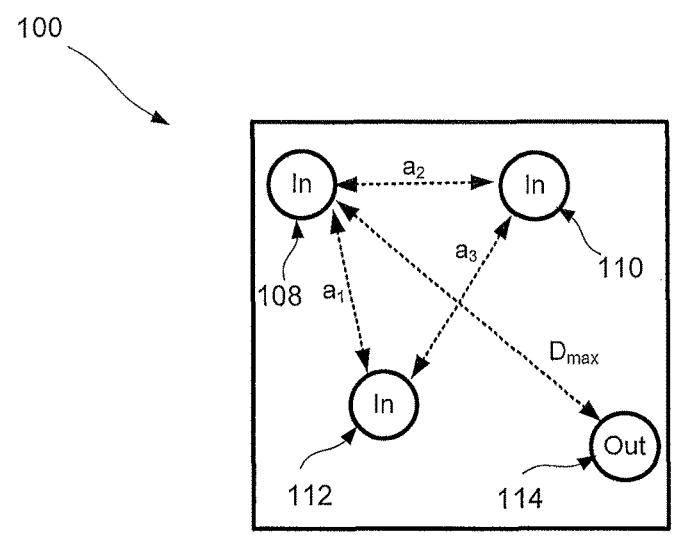
FIG. 2 illustrates a top view of the spin torque majority gate device of FIG. 1.

FIG. 1 illustrates a cross-sectional side view of a spin torque majority gate (STMG) device 100 according to some embodiments. FIG. 2 is a top view illustration of the STMG device 100 of FIG. 1. The STMG device 100 comprises a free ferromagnetic layer 102, a spin mixing layer 104 arranged above, e.g., contacting, the free ferromagnetic layer 102 and a non-magnetic tunnelling layer 106 arranged above, e.g., contacting, the spin mixing layer 104. The STMG device 100 further comprises a plurality of input elements 108, 110, 112 and an output element 114 arranged above the non-magnetic tunnelling layer 106. Each input element 108, 110, 112 and the output element comprise a fixed ferromagnetic layer 116, and a contact layer 118. In the illustrated embodiment, the fixed ferromagnetic layer 116 contacts the non-magnetic tunnelling layer 106. The STMG device 100 is further arranged on top of a substrate 120.

In FIG. 1 the STMG device 100 is arranged for out-of-planemagnetization, or perpendicular magnetization, as indicated by the white triangles 122. As described herein, an out-of-plane magnetization or a perpendicular magnetization refers to the crystalline anisotropy where the direction of the magnetization of the active layers such as the free ferromagnetic layer 102 and the fixed ferromagnetic layer 116 is perpendicular to the planes of the active layers. While the STMG device 100 of FIG. 1 has an out-of-plane or perpendicular magnetization, other arrangements are possible, where the active layers such as the free ferromagnetic layer 102 and the fixed ferromagnetic layer 116 have a direction of magnetization that is parallel to the planes of the active layers. Such arrangements are referred to as in-plane magnetization or parallel magnetization.

The input elements 108, 110, 112 and the output element 114 in the illustrated embodiment of FIG. 1 are formed as nanopillars arranged on the non-magnetic tunnelling layer 106. A nanopillar structure can have a vertical height that is greater than a lateral width, according to some embodiments. It will be appreciated, however, that in other embodiments the design of the elements 108, 110, 112, 114 may differ and the at least one of the elements 108, 110, 112, 114 may for example be formed as a layer structure or a similar structure. In contrast to a nanopillar structure, a layer structure can have a vertical height that is smaller than a lateral width, according to some other embodiments.

It will be further appreciated that the number of input elements and/or the number of output elements can be different than the number of input and output elements of the illustrated embodiment of FIGS. 1 and 2. The number of input elements may for example be five or seven, for example.

During operation of the STMG device 100, electrical voltages, e.g., pulsed electrical voltages, are applied to the contact layers 118 of each of the input elements 108, 110, 112 such that an electrical current is generated through each of the input elements 108, 110, 112. Thus generated currents that flow through the fixed ferromagnetic layers 116 of each of the input elements 108, 110, 112 having a magnetization orientation, e.g., an out-of-plane magnetization orientation, are spin-polarized by the fixed ferromagnetic layers 116. Without being bound to any theory, the spin-polarized electrical currents result when electrons, initially having mixed or unpolarized spins, interact with the magnetization of the fixed ferromagnetic layers of the respective input elements 116 to become spin-polarized. As understood in the relevant technology, the spin of an electron is an angular momentum intrinsic to the electron which differs from the angular momentum caused by the orbital motion of the electron in question. The spin-polarized currents results from the generation of spin-polarized populations of electrons that exhibit excess of spin up or spin down electrons. The spin direction, i.e. spin up or spin down, of the spin-polarized electrical currents are further set by the magnetization direction of the fixed ferromagnetic layers 116 and the polarity of the applied electrical voltage of each the input element 108, 110, 112. Thus generated spin-polarized electrical currents are injected by means of tunnelling through the non-magnetic layer 106 into the spin mixing layer 104.

The spin mixing layer 104 allows for mixing of the spins of electrons originating from the spin-polarized currents generated in the respective input elements 108, 110, 112. As a result, a net spin of the electrons corresponding to a majority of electron spins originating from the respective input elements is created within the spin mixing layer 104.

The free ferromagnetic layer 102 arranged below and in contact with the spin mixing layer 104 is thereby exposed to the electrons having the net spin resulting from the mixing of the spins in the spin mixing layer 104. More specifically, the free ferromagnetic layer 102 is affected by the net spin by a physical phenomenon referred to as spin transfer torque effect, sometimes also referred to as the spin transfer switching effect. In the spin transfer torque effect the spin-polarized currents, i.e. spin aligned electrons, induce torque to the domains of the free ferromagnetic layer 102 such that the magnetization direction of the free ferromagnetic layer 102 is affected. Under certain circumstances, e.g., when the induced torque exceeds a threshold or a critical value, the magnetic orientation of the free ferromagnetic layer 102 may be changed. The change in the magnetic orientation in turn leads to a change in the electrical resistance of a magnetic tunnelling junction 111 that can be detected using a read current between the input elements 108, 110, 112 and the output element 114, as described in more detail below.

The arrangement of the STMG device 100 including a spin mixing layer 104 is advantageous as the magnetization of the free ferromagnetic layer 102 is set more efficiently such that a more evenly distributed and homogenous magnetization is achieved in the free ferromagnetic layer 102. A more reliable STMG device 100 is thereby achieved.

As described above, the term "fixed" used to describe the feature fixed ferromagnetic layer 116 refers to the magnetization of the fixed ferromagnetic layer 116 that is substantially unaffected by the spin of the electrons passing through the layer 116. In contrast, as described above, the term "free" used to describe the feature free ferromagnetic layer 102, refers to the magnetization of the free ferromagnetic layer 102 can be affected, e.g., switched, by the spin of the electrons, e.g., by a net spin of the electrons from the spin mixing layer 104 and passing through the free ferromagnetic layer 102. That is. each of the fixed ferromagnetic layers 116 is configured to generate spin-polarized electrons in response to a voltage applied to the respective input elements, and the spin mixing layer 104 is configured to mix the spins of the spin-polarized electrons passing therethrough, such that when a combined net spin of the spin-polarized electrons passing through the spin mixing layer 104 and further through the free ferromagnetic layer 102 exceeds a critical value, the free ferromagnetic layer 102 undergoes a switching of an orientation of magnetization. As configured, because the net spin of the spin-polarized electrons determines whether the free ferromagnetic layer 102 undergoes a switching, the relative contribution from each of the fixed ferromagnetic layers 116 can be different, e.g., based independently connected input elements 108, 110, 112. The orientation of the magnetization of free ferromagnetic layer 102 that is parallel or antiparallel relative to the fixed ferromagnetic layer 116 corresponds to a logic state of the majority gate device, which can be read out based on a current measured from the output element 114.

In order to provide an efficient transfer of the net spin of the electrons of the spin mixing layer 104 to the free ferromagnetic layer 102, it is advantageous if the coherence length of the spin mixing layer 104 is large. A large coherence length provides a better distributed and more homogenous spin distribution within the layer 104. A spin coherence length refers to a propagation distance over which a coherent wave maintains a specified degree of coherence. In other words, a spin coherence length refers to a length over which electrons having polarized spins can travel without substantially losing the polarization. A large spin coherence length thereby allows for proper mixing of the spin in the spin mixing layer 104, the spin being induced by the respective input elements 108, 110, 112.

Next, the output element 114 of the STMG device 100 will be described. The output element 114 is as shown in FIG. 1 arranged above the non-magnetic tunnelling layer 106 and comprises a fixed ferromagnetic layer 116a. The fixed ferromagnetic layer 116a can be formed of the same or different ferromagnetic material compared to the ferromagnetic layer 116 of the input elements 108, 110, 112. The fixed ferromagnetic layer 116a, the non-magnetic tunnelling layer 106, the spin mixing layer 104, and the free ferromagnetic layer 102 may be considered as a magnetic tunnelling junction MTJ 111, which may efficiently be read out such that it is possible to determine the majority of inputs based on the state of the free ferromagnetic layer 102. In other words, the magnetization of the free magnetic layer 102 may be read out by measuring the current through the output element 114, e.g. by measuring the resistance over the MTJ 111.

More specifically, the switching functionality of the MTJ 111 of the STMG device 100 is achieved by the fixed ferromagnetic layer 116a, the non-magnetic tunnelling layer 106, and the free ferromagnetic layer 102 in which a quantum mechanical switching effect of the tunnel magnetoresistance (TMR) is induced as electrons tunnel through the non-magnetic tunnelling layer 106 and the spin mixing layer 104. The value of TMR depends on the magnetization orientations of the fixed ferromagnetic layer 116a and the free ferromagnetic layer 102. In the STMG 100 of FIG. 1 having an out-of-plane anisotropy, the fixed ferromagnetic layer 116a and the free ferromagnetic layer 102 having parallel magnetization orientations correspond to a low resistance state of the MTJ 111, while the fixed ferromagnetic layer 116a and the free ferromagnetic layer 102 having an opposite, i.e. anti-parallel, magnetization orientations, correspond to a high resistance state of the MTJ 111. Consequently, by reading out the resistance of the MTJ 111, information pertaining to the magnetization orientation of the free ferromagnetic layer 102 may be deduced for a given magnetization orientation of the fixed ferromagnetic layer 116a. Other arrangements are possible, e.g., an STMG having an in-plane anisotropy where the fixed ferromagnetic layer and the free ferromagnetic layer have magnetization orientations that are either parallel or antiparallel in a direction parallel to the plane of the active layers, corresponding to low and high resistance states of the MTJ, respectively.

To this end, the STMG device 100 may be switched between a plurality of states having different electrical resistances by changing the magnetization of the free ferromagnetic layer 102. The STMG device 100 may therefore be configured as a resistance change memory device whose memory state can be switched between a plurality of memory states, e.g., a high or a relatively higher resistance state and a low or relatively lower resistance state by using the direction of electrical currents flowing through the respective input elements 108, 110, 112.

In other words, the net spin of the spin mixing layer 104 set by the majority of input elements 108, 110, 112 may induce a magnetization orientation of the free ferromagnetic layer 102 such that the MTJ 111 changes between an anti-parallel orientation to a parallel orientation. For instance, switching the MTJ 111 from an anti-parallel orientation to a parallel orientation can correspond to a logical operation to write "1". Similarly, switching the MTJ 111 from a parallel orientation to an anti-parallel orientation can correspond to a logical operation to write "0". However, the logical operations to write "1" and "0" as they correspond to the magnetization orientations of the MTJ 111 can be interchangeable. The output element 114 may as described above be used to read out the logical state resulting from the logical operation. Hence, the magnetization as read out by the output element may represent a computational variable.

Now referring to FIG. 2, the spin mixing layer 104 of the STMG device 100 comprises a material having a spin coherence length larger or equal to a maximum distance $a_3$ between the plurality of input elements 108, 110, 112, according to some embodiments. Having such material serve as the mixing layer 104 can be advantageous for efficiently mixing the electron spins originating from the respective input elements 108, 110, 112, whose mixing can be controlled independently based on the relative distances between the input elements 108, 110, 112, such that the free ferromagnetic layer 102 of the device 100 can be affected substantially by the net spin of the spin mixing layer 104. In other words, having the spin coherence length larger or equal to a maximum distance between the plurality of input elements 108, 110, 112 can enable the respective electron spins inputted to the spin mixing layer 104 to be mixed in an efficient manner, such that substantially all inputted electron spins are mixed.

According to some embodiments, the spin mixing layer 104 of the STMG device 100 further comprises a material having a spin coherence length that is larger or equal to a maximum distance $D_{max}$ between any of the plurality of input elements 108, 110, and 112 and the output element 114. Having such material serve as the mixing layer 104 can be advantageous for achieving a more reliable setting and readout of the free ferromagnetic layer 106 of the of the STMG device 100. As shown in FIG. 2, the plurality of input elements 108, 110, and 112 and the output element 114 are arranged non-symmetrically. This design is possible as the spin mixing layer 104 offers an improved design freedom as compared to prior art. This is a result of the net spin of the spin mixing layer 104 which results from currents passing through the plurality of input elements 108, 110, 112 and efficiently mixed. The mixing of the electron spins in the spin mixing layer 104 thus results in a configuration of the STMG device 100 in which the relative distances between the respective input elements become less important, for setting the magnetization of the free ferromagnetic layer 102 homogenously, as the respective electron spins are mixed in the spin mixing layer 104. Advantageously, the free ferromagnetic layer 102 is predominantly or essentially affected by a single net spin, irrespective of the positioning of the respective input elements 108, 110, 112.

According to other embodiments, the input elements and the output element may be arranged symmetrically.

Figure 3:
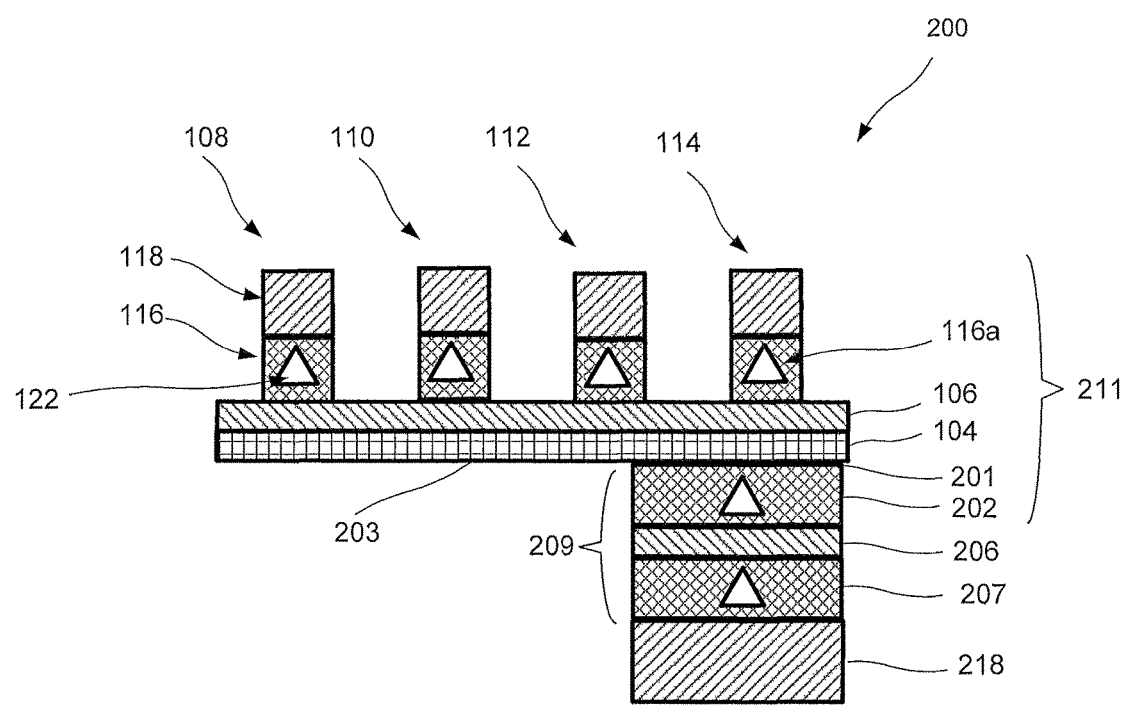
FIG. 3 illustrates a cross-sectional side view of a spin torque majority gate device according to some other embodiments.

FIG. 3 illustrates a STMG device 200 according to some other embodiments. The STMG device 200 comprises a staked structure where a surface 201 of a free ferromagnetic layer 202 facing a spin mixing layer 104 has an area which is smaller than an area of a surface 203 of the of the spin mixing layer 104 facing the free ferromagnetic layer 202. This arrangement can be advantageous in that the design freedom of the device 200 is increased and at the same time the device 200 may be made smaller. The structure of the STMG device 200 is, from the spin mixing layer 104 and above to the contacts layers 118 the same as for the STMG device 100, c.f. FIG. 1.

In contrast to the STMG device 100 of FIG. 1, however, the STMG device 200 of FIG. 3 comprises an additional non-magnetic tunnelling layer 206 arranged below the free ferromagnetic layer 202, and an additional fixed ferromagnetic layer 207 arranged below the additional non-magnetic tunnelling layer 202. The additional fixed ferromagnetic layer 207 may be configured as a reference layer for which the magnetization direction is known. A magnetic tunnelling junction, MTJ, 209 is formed by the free ferromagnetic layer 202, the additional non-magnetic tunnelling layer 206 and the additional fixed ferromagnetic layer 207. The function of this MTJ 209 is the same as discussed above in relation to the MTJ 111 of FIG. 1. By providing an MTJ 209 which has a well-defined geometry where the additional non-magnetic tunnelling layer 206 is arranged below the free ferromagnetic layer 202, and the additional fixed ferromagnetic layer 207 below the additional non-magnetic tunnelling layer 206, the readout of the STMG device 200 is improved. In other words, by measuring the electrical resistance between the contact layer 118 of the output element 114 and a contact gate 218 of the MTJ 209 a better signal to noise may be achieved as essentially two MTJs in series are probed as indicated by the MTJs 209 and 211 respectively. Hence, a stronger readout signal may be achieved by the arrangement disclosed in FIG. 3.

In the embodiments disclosed above the ferromagnetic layers of the STMG devices 100 and 200 have an out-of-plane magnetization, which is advantageous in that that it is easier to switch the magnetization of the free ferromagnetic layers, and in that a stronger and more distinct read out signal may be achieved as compared when the ferromagnetic layers have an in-plane magnetization.

The ferromagnetic layers 102, 116, 116a, 202, 207 of the spin torque majority gate devices 100, 200 may, however, have in-plane magnetizations, which is advantageous as a device which is easy to fabricate is achieved.

The ferromagnetic layers 102, 116, 116a, 202, 207 may include a ferromagnetic material, such as, for example, cobalt, nickel, iron, a cobalt-iron alloy, or nickel-iron alloy, a cobalt-nickel alloy, or an iron-platinum alloy.

The STMG device 100, 200 may be fabricated with out-of-plane magnetization or in-plane magnetization by using for example CoPt, FePt, CoFeB, TbCoFe, CoFe or NiFe.

The non-magnetic tunnelling layer 106 and/or the additional non-magnetic tunnelling layer 206 of the spin torque majority gate device may comprise a material chosen from a group consisting of MgO, $Al_2O_3$, $TiO_2$, and $Ta_2O_5$, which is advantageous in that a an efficient tunnelling barrier may be achieved.

According to some embodiments the spin mixing layer 104 may comprise a material chosen from a group consisting of Cu, CuN, Au, Ag, and alloys thereof, which is advantageous in that an efficient spin mixing layer 104 having a desired spin coherence length may be achieved. The coherence length may for example be on the order of about 500 nanometers.

According to other embodiments the spin mixing layer 104 may comprise graphene, which is advantageous in that an ultrathin layer is provided which is an efficient spin mixing layer 104 having a desired spin coherence length may be achieved. The coherence length may for example be on the order of 1 micrometer of above.

Even though the invention has been described with reference to specific exemplifying embodiments thereof, many different alterations, modifications and the like will become apparent for those skilled in the art. Variations to the disclosed embodiments may be understood and effected by the skilled addressee in practicing the claimed invention, from a study of the drawings, the disclosure, and the appended claims. Furthermore, in the claims, the word "comprising" does not exclude other elements or steps, and the indefinite article "a" or "an" does not exclude a plurality.

What is claimed is:
1. A spin torque majority gate device, comprising:
    a free ferromagnetic layer;
    a spin mixing layer formed above the free ferromagnetic layer;
    a non-magnetic tunnelling layer formed above the spin mixing layer;
    a plurality of input elements formed above the non-magnetic tunnelling layer, each of the input elements comprising a fixed ferromagnetic layer; and
    an output element formed above the non-magnetic tunnelling layer and comprising a fixed ferromagnetic layer,
    wherein the spin mixing layer is formed of a material having a spin coherence length that is greater than or equal to a maximum lateral distance between any two of the plurality of input elements.

2. The spin torque majority gate device according to claim 1, wherein the spin mixing layer is formed of a material having the spin coherence length that is greater than or equal to the maximum lateral distance between any of the plurality of input elements and the output element.

3. The spin torque majority gate device according to claim 1, wherein the spin mixing layer is formed of a material chosen from the group consisting of Cu, CuN, Au, Ag, and alloys thereof.

4. The spin torque majority gate device according to claim 1, wherein the spin mixing layer is formed of graphene.

5. The spin torque majority gate device according to claim 1, further comprising:
    an additional non-magnetic tunnelling layer formed below the free ferromagnetic layer; and
    an additional fixed ferromagnetic layer formed below the additional non-magnetic tunnelling layer,
    wherein a magnetic tunnelling junction is formed by at least portions of the free ferromagnetic layer, the additional non-magnetic tunnelling layer and the additional fixed ferromagnetic layer.

6. The spin torque majority gate device according to claim 1, wherein the free and fixed ferromagnetic layers have an in-plane magnetization in which a magnetization orientation direction is parallel to a plane of the free and fixed ferromagnetic layers.

7. The spin torque majority gate device according to claim 1, wherein the free and fixed ferromagnetic layers have an out-of-plane magnetization in which a magnetization orientation direction crosses a plane of the free and fixed ferromagnetic layers.

8. The spin torque majority gate device according to claim 1, wherein the non-magnetic tunnelling layer is formed of a material chosen from the group consisting of MgO, $Al_2O_3$, $TiO_2$ and $Ta_2O_5$.

9. The spin torque majority gate device according to claim 1, wherein a surface of the free ferromagnetic layer facing the spin mixing layer has an area that is smaller than an area of a surface of the spin mixing layer facing the free ferromagnetic layer.

10. The spin torque majority gate device according to claim 1, wherein each of the free ferromagnetic layer and fixed ferromagnetic layers of the input elements and the output elements is formed of a material chosen from the group consisting of CoPt, FePt, CoFeB, TbCoFe, CoFe and NiFe.

11. The spin torque majority gate device according to claim 1, wherein the fixed ferromagnetic of each of the input elements is configured to generate spin-polarized electrons in response to a voltage applied to a respective input element, and wherein the spin mixing layer is configured to mix the spins of the spin-polarized electrons passing therethrough, such that when a combined net spin of the spin-polarized electrons passing through the spin mixing layer and further through the free ferromagnetic layer exceeds a critical value, the free ferromagnetic layer undergoes a switching of an orientation of magnetization in the free ferromagnetic layer.

12. The spin torque majority gate device according to claim 11, wherein the fixed ferromagnetic layer of each of the input elements is independently configured to contribute a different amount of spin-polarized electrons of a total amount of spin-polarized electrons passing through the spin mixing layer.

13. The spin torque majority gate device according to claim 12, wherein switching of the orientation of magnetization in the free ferromagnetic layer results in the orientation in the free ferromagnetic layer that is parallel or antiparallel relative to the fixed ferromagnetic layer.

14. The spin torque majority gate device according to claim 13, wherein the orientation of the magnetization that is parallel or antiparallel relative to the fixed ferromagnetic layer corresponds to a logic state of the spin torque majority gate device.

15. The spin torque majority gate device according to claim 14, configured such that the logic state of the majority gate device is determined based on a current measured from the output element that is laterally separated from the input elements while being formed at the same vertical level.

16. The spin torque majority gate device according to claim 1, wherein the input elements are separated from each other, and wherein the spin mixing layer is contiguous across the input elements.

17. The spin torque majority gate device according to claim 16, wherein the input elements are separated from each other, and wherein the non-magnetic tunneling layer is contiguous across the input elements.

* * * * *